United States Patent
Chan et al.

(10) Patent No.: US 8,806,416 B1
(45) Date of Patent: Aug. 12, 2014

(54) METHOD AND CIRCUIT TO IMPLEMENT A STATIC LOW POWER RETENTION STATE

(71) Applicant: QUALCOMM Incorporated, San Diego, CA (US)

(72) Inventors: Patrick Chan, San Jose, CA (US); Rudolph Yeung, Sunnyvale, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/781,746

(22) Filed: Feb. 28, 2013

(51) Int. Cl.
 *G06F 17/50* (2006.01)
(52) U.S. Cl.
 USPC .......................................................... 716/136
(58) Field of Classification Search
 USPC .......................................................... 716/136
 See application file for complete search history.

(56) References Cited

U.S. PATENT DOCUMENTS

| | | | |
|---|---|---|---|
| 7,123,033 B1 | 10/2006 | Wright | |
| 7,589,506 B2 | 9/2009 | Brown | |
| 2008/0127015 A1* | 5/2008 | Chandramouli et al. | 716/5 |
| 2009/0051496 A1 | 2/2009 | Pahlavan et al. | |
| 2011/0029292 A1 | 2/2011 | Schellekens et al. | |
| 2011/0221469 A1* | 9/2011 | Schlagenhaft | 326/16 |
| 2012/0249093 A1 | 10/2012 | Grbo et al. | |

* cited by examiner

*Primary Examiner* — Vuthe Siek
(74) *Attorney, Agent, or Firm* — Novak Druce Connolly Bove + Quigg LLP

(57) ABSTRACT

An apparatus to pre-condition an operating integrated circuit (IC) device in a static low power retention state. The apparatus includes a pseudo random number generator that generates a pseudo random number value to pre-condition the static low power retention state of the operating IC device. The apparatus also includes a controller that drives the pseudo random number value into a test scan chain linking logic elements of the operating IC device responsive to the operating IC device entering a sleep mode. Driving the pseudo random number value into the test scan chain by the controller places the operating IC device into the static low power retention state.

20 Claims, 10 Drawing Sheets

METHOD AND CIRCUIT TO IMPLEMENT A STATIC LOW POWER RETENTION STATE

BACKGROUND

1. Field

The present disclosure generally relates to integrated circuit design. More specifically, the present disclosure relates to designing integrated circuits having a static low power retention state.

2. Background

Integrated circuits (ICs) are commonly designed using design-for-test techniques such as scan based designs in which scan flip flops are included in the IC designs to facilitate test mode operations of the IC. Scan flip flops are similar to standard flip flops but include a scan input, a scan output and an enable input. The enable input toggles the scan flip flop between an operating mode and a testing mode. When the enable input is asserted, the scan flip flops function in a scan mode in which test inputs and test outputs are transmitted via the scan input and the scan output. When the enable input is de-asserted, the scan flip flop operates as a standard flip flop in which input is received via the data input.

In scan based designs, registers in the design are converted to scan flip flops 102. The scan flip flops 102 may be stitched together, as shown in FIG. 1, to operate as an oversized shift register during a test mode of operation. During the test mode, a shift operation is first performed in which a test vector is shifted into the internal circuitry of an IC design via the scan flip flops 102. The test vector propagates through the combinational logic of the IC's internal circuitry, which is also referred to herein as the "cone of logic" 104. A capture operation can then be performed in which a test response is captured by the scan flip flop 102. The response data from the cone of logic 104 is shifted out while shifting in a next test vector.

During each shift, a large number of scan flip flops toggle simultaneously in response to the test vector input. These toggles cause additional toggle activity throughout the entire cone of logic 104. Toggle activity during a shift can greatly exceed the toggle activity that occurs during the normal operating mode of the circuitry. The toggle activity consumes enormous amounts of power, which can detrimentally affect the correct operation of the circuit during testing, as well as decreasing circuit reliability.

One design-for-test technique for reducing power consumption during shift operations is referred to as "gated-q" design. According to gated-q design, logic gates are added to the circuit design between the q-output of each scan flip flop and the cone of logic 104. A shift line to the logic gates is asserted during shift operations. Assertion of the shift line holds the output from the logic gates to the cone of logic 104 in a single state during shift operations. In this way, the q-output of each scan flip flop is "gated" during shift mode.

An example of q-gating is shown in FIG. 2 in which OR gates 202 gate the scan flop output. The OR gates 202 drive a logic '1' at each input to the cone of logic 204 when the shift line 206 is asserted (e.g., during a shift operation). Because the inputs to the cone of logic 204 are held at a logic '1', the combinational logic circuitry in the cone of logic 204 does not toggle during the shift operation so dynamic power consumption is substantially reduced.

Another example of q-gating is shown in FIG. 3 in which NOR gates 302 hold inputs to the cone of logic 304 in a single state. The NOR gates 302 hold logic '0' at each input to the cone of logic 304 during a shift operation in response to assertion of a shift line 306. An input to each of the NOR gates 302 from the corresponding scan flip flop 308 is inverted so that the NOR gates 302 transmit the same value received from the scan flip flop 308 when the shift line 306 is not asserted. Holding the inputs to the cone of logic 304 in a single state prevents propagation of toggle activity throughout the cone of logic 304 and thereby prevents substantial dynamic power losses.

While the q-gating examples described with respect to FIGS. 2 and 3 substantially reduce power that would otherwise be consumed due to propagated toggling of the combinational logic (e.g., dynamic power losses), IC designs are also subject to static power losses. Static power losses due to current leakage in the combinational logic may be even greater than dynamic power in present IC designs. The term "leakage power" refers to the power consumed by a circuit design due to leakage currents when the transistors of the circuit are in their OFF state.

Leakage power consumed by a logic gate depends on the applied input pattern. For example, FIG. 4 shows a 2-input NAND gate 402 and a schematic diagram 404 of the transistors within the 2-input NAND gate. When a '00' input is applied, less leakage power is consumed, as compared to all other input combinations. This is because both transistors T1 and T2 are OFF. This creates a higher drain to source resistance that results in reduced leakage current and reduced leakage power.

The minimum leakage state of a circuit design is the state of the design that consumes the least leakage power. This occurs when as many possible logic gates or other components are parked in their lowest leakage state, such that the overall leakage power of the circuit is at a minimum. The problem of identifying a minimum leakage state for a given design is a complex problem for which various solutions or approximations are postulated. Such solutions, however, are generally unsuitable for practical applications in designing ICs.

SUMMARY

According to one aspect of the present disclosure, an apparatus to pre-condition an operating integrated circuit (IC) device in a static low power retention state is described. The apparatus includes a pseudo random number generator that generates a pseudo random number value to pre-condition the static low power retention state of the operating IC device. The apparatus further includes a controller that drives the pseudo random number value into a test scan chain linking logic elements of the operating IC device responsive to the operating IC device entering a sleep mode. Driving the pseudo random number value into the test scan chain by the controller places the operating IC device into the static low power retention state.

According another aspect of the present disclosure, a method for preconditioning an operating integrated circuit (IC) device in a static low power retention state is described. The method includes generating a pseudo random number value to pre-condition the static low power retention state of the operating IC device. The method also includes driving the pseudo random number value into a test scan chain linking logic elements of the operating IC device responsive to the operating IC device entering a sleep mode. Driving the pseudo random number value into the test scan chain places the operating IC device into the static low power retention state.

According to a further aspect of the present disclosure, an apparatus to pre-condition an operating integrated circuit (IC) device in a static low power retention state is described. The apparatus a means for generating a pseudo random number value to pre-condition the static low power retention state of the operating IC device. The apparatus further includes a means for driving the pseudo random number value into a test scan chain linking logic elements of the operating IC device responsive to the operating IC device entering a sleep mode. The means for driving the pseudo random number value into the test scan chain places the operating IC device into the static low power retention state.

Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
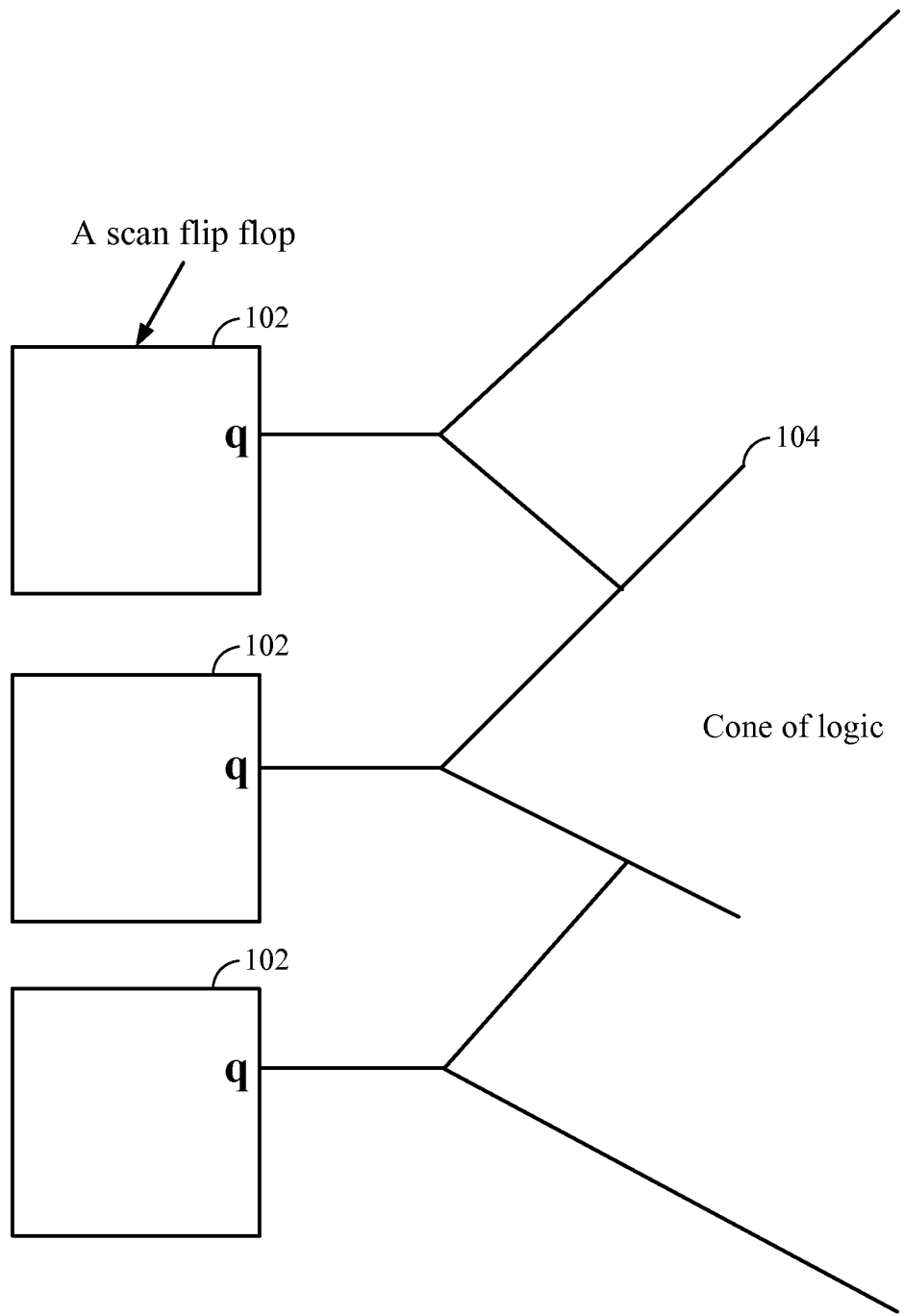
FIG. 1 is a block diagram illustrating a conventional set of scan flip flops for testing logic circuitry.
Figure 2:
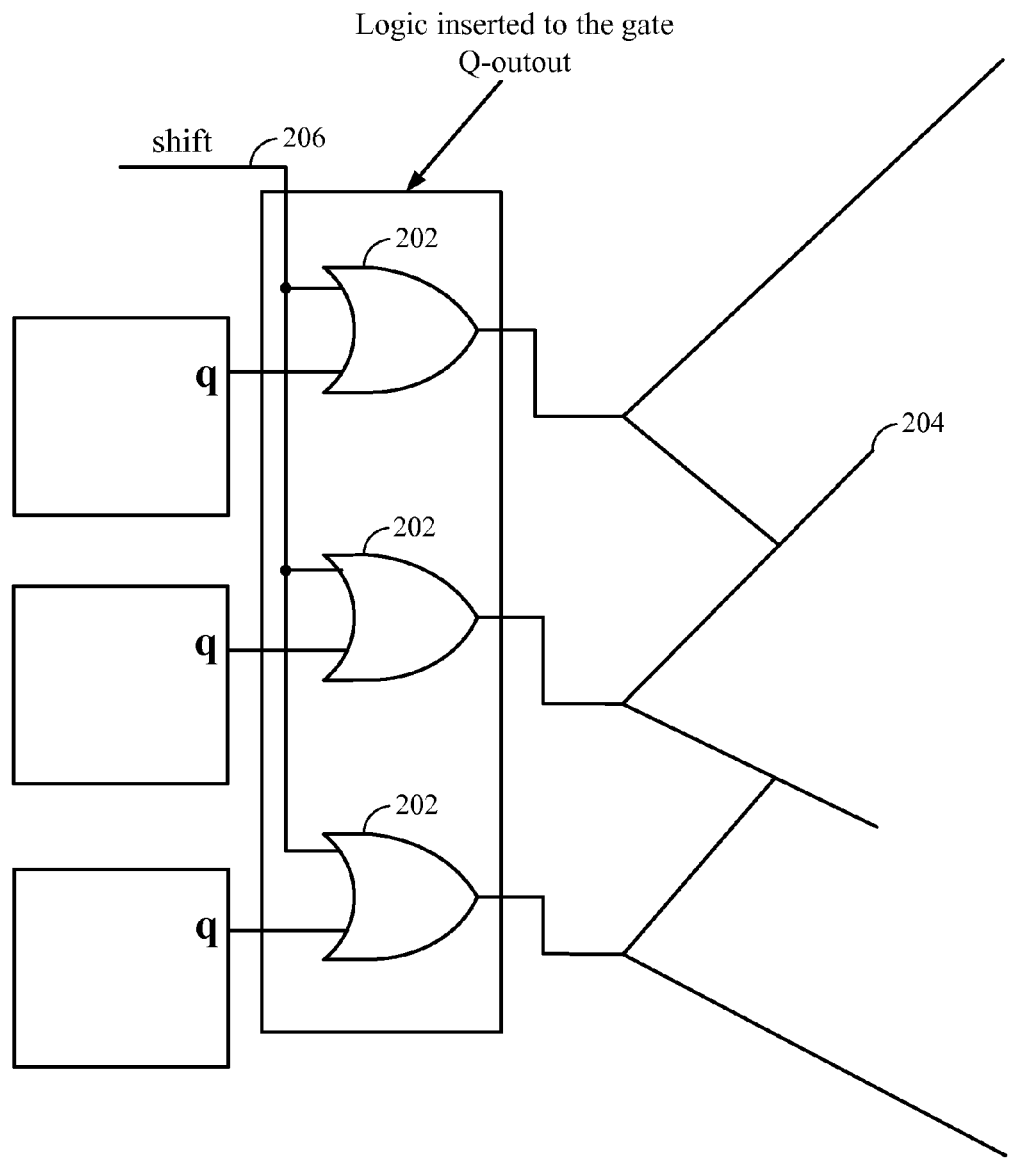
FIG. 2 is circuit schematic diagram illustrating a conventional gated-q design for testing logic circuitry.
Figure 3:
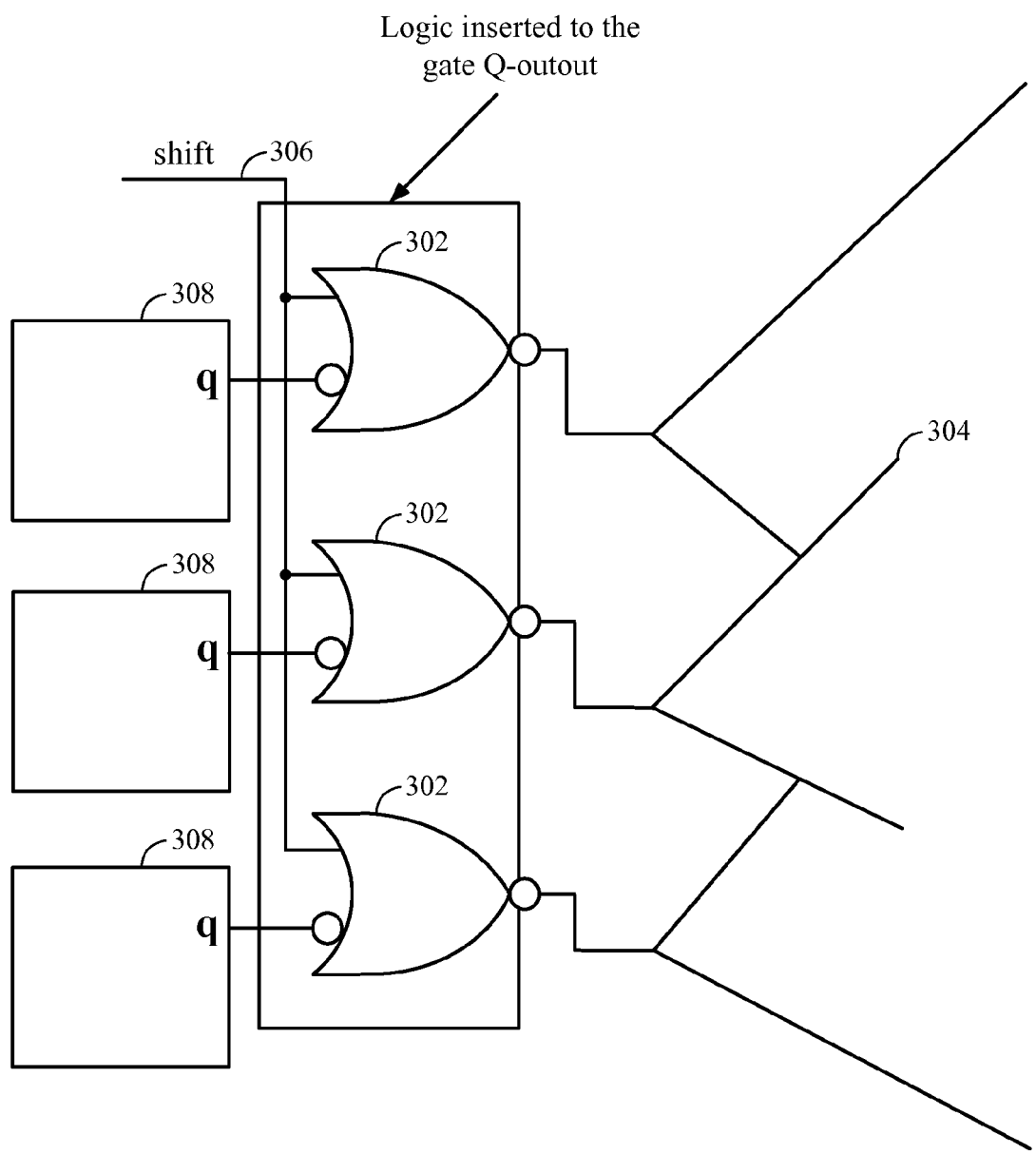
FIG. 3 is circuit schematic diagram illustrating a conventional gated-q design for testing logic circuitry.
Figure 4:
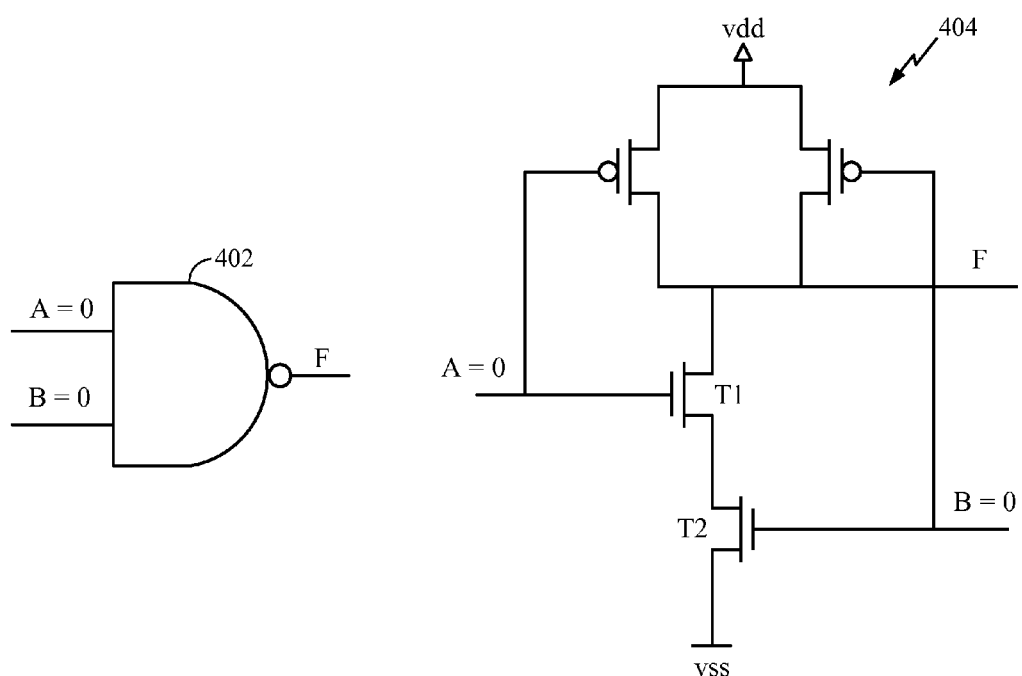
FIG. 4 is diagram of a standard symbol for a NAND gate and a schematic diagram of circuitry for implementing the NAND gate.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

In low power designs today, there are techniques (e.g., power gating) for reducing leakage in CMOS (complementary metal-oxide-semiconductor) chips of IC devices. In cases where power gating incurs too much overhead time (e.g., in power down, power up, and restoring states), or overhead in implementation (e.g., verification, power grid design, general ROI (return on investment)), a static voltage scaling technique may be used in the circuit blocks of an IC design. Often when a static voltage scaling state is entered, a large amount of logic elements in the circuit block are in a random state depending on the state of the IC device. Because CMOS logic gate leakage may vary widely between states, the exact leakage current, and the sleep power of the IC device is not guaranteed. In one aspect of the disclosure, an IC device is placed in a static low power retention state prior to entering a voltage scaling mode. The resulting leakage for the circuit is deterministic across different parts of the circuit (with known state), and may be optimized.

Aspects of the present disclosure reduce static leakage power by driving a pseudo random pattern into one or more test scan chains coupled to logic elements of an operating integrated circuit (IC) device of an IC design in response to the operating IC device entering a sleep mode. As described herein, logic elements may include, but are not limited to, combinational logic, logic gates, registers, adders, memory, or other like circuitry within an IC design. In one configuration, the pseudo random pattern places the operating IC device into a static low power retention state. The pseudo random pattern is driven through the test scan chains of the IC device, which causes the logic elements to enter the static low power retention state. According to aspects of the present disclosure, the static low power retention state approximates a minimum leakage state (MLS) of the IC device. The pseudo random pattern may be driven through the test scan chains prior to entering a sleep mode of the operating IC device to place the operating IC device in the known static low power retention state during the sleep mode. Although the term "minimum" is used throughout this application, it should be understood that reduced or minimum is intended to be covered.

Aspects of the present disclosure may achieve a static low power retention state at a pre-silicon stage by determining a pseudo-random pattern (vector) that causes the logic elements of an operating IC device to approximate a minimum leakage state. An automatic test pattern generation (ATPG) tool may be used to determine the minimum leakage state (MLS) based, for example, on a bridging fault model. A test pattern for input to a scan chain of an operating IC to effect the minimum leakage state may then be determined.

According to another aspect of the present disclosure, a test pattern, which effects a minimum leakage state, may also be determined during design time of the IC device by running simulations to determine a lowest quiescent state vector (e.g., using IDDQ (quiescent supply current) pattern generation methods), for example.

Simulations may be performed, using a final logic netlist of an IC design to determine a lowest quiescent state vector of the IC design. The simulations may include generating pseudo-random patterns as input to test scan chains of the IC design. The pseudo-random patterns may be generated by a pseudo-random pattern generator by applying a seed value and a clock to a pseudo-random number generation process, for a number of clock cycles. According to aspects of the present disclosure, the lowest quiescent state vector of the IC design, as determined by the simulations for example, corresponds to a pseudo-random pattern that may be input to a test scan chain of the IC design to achieve a minimum leakage state of the IC device.

According to aspects of the present disclosure, hardware support for a pseudo-random number generator may be provided during design time of an IC device. The hardware support may include a linear feedback shift register (LFSR), scan chains, and counters, for example. A predictable and controllable static low power retention state may be achieved by reproducing the pseudo-random pattern following fabrication of the IC device.

According to aspects of the present disclosure, rather than store the pseudo-random pattern on the IC device for use during operation of an IC device, the seed value and clock duration (i.e., number of clock cycles) that was applied to the pseudo-random number generation process during the simulation to generate the pseudo-random pattern may be stored on the IC device, for example. An LSFR may be configured on the IC device to perform the same pseudo-random number generation process as was performed to generate the pseudo-random pattern in the simulation. Applying the seed value to the LFSR for the stored duration causes the LFSR to generate the pseudo-random pattern that, when input to test scan chains of the IC device, achieves the minimum leakage state of the IC device.

According to an aspect of the present disclosure, once a leakage state of the logic elements that approximates a minimum leakage state is determined, the corresponding test vector pattern is mapped to, for example, an LFSR generator. The LFSR generation may be configured to ensure that the test vector pattern can be generated during IC device operation. The test vector pattern should be generated from the LFSR with a sufficiently small number of clock cycles. The counter is also used to count the number of clock cycles for propagating a seed vector to implement the static low power retention state, when the device enters sleep mode with voltage scaling methods. This configuration enables a minimum IC device sleep power for modes that use static voltage scaling, and also enables conformance with published customer specifications. This technique may also be combined with other low power techniques such as clock gating, back biasing, and the like.

In operation, a linear feedback shift register (LFSR) is fed the seed value and the cycle duration value to generate the pseudo-random pattern (MLS vector) that implements the minimum leakage state of an IC design. In this configuration, an existing scan chain infrastructure of the IC design is reused for the purpose of loading device control registers to achieve the static low power retention state of the various logic elements prior to entering a voltage scaling mode. When the MLS vector is driven through the existing scan chain infrastructure of the operating IC device, for example during a sleep mode of operation, the IC device is placed in the static low power retention state.

Figure 5:
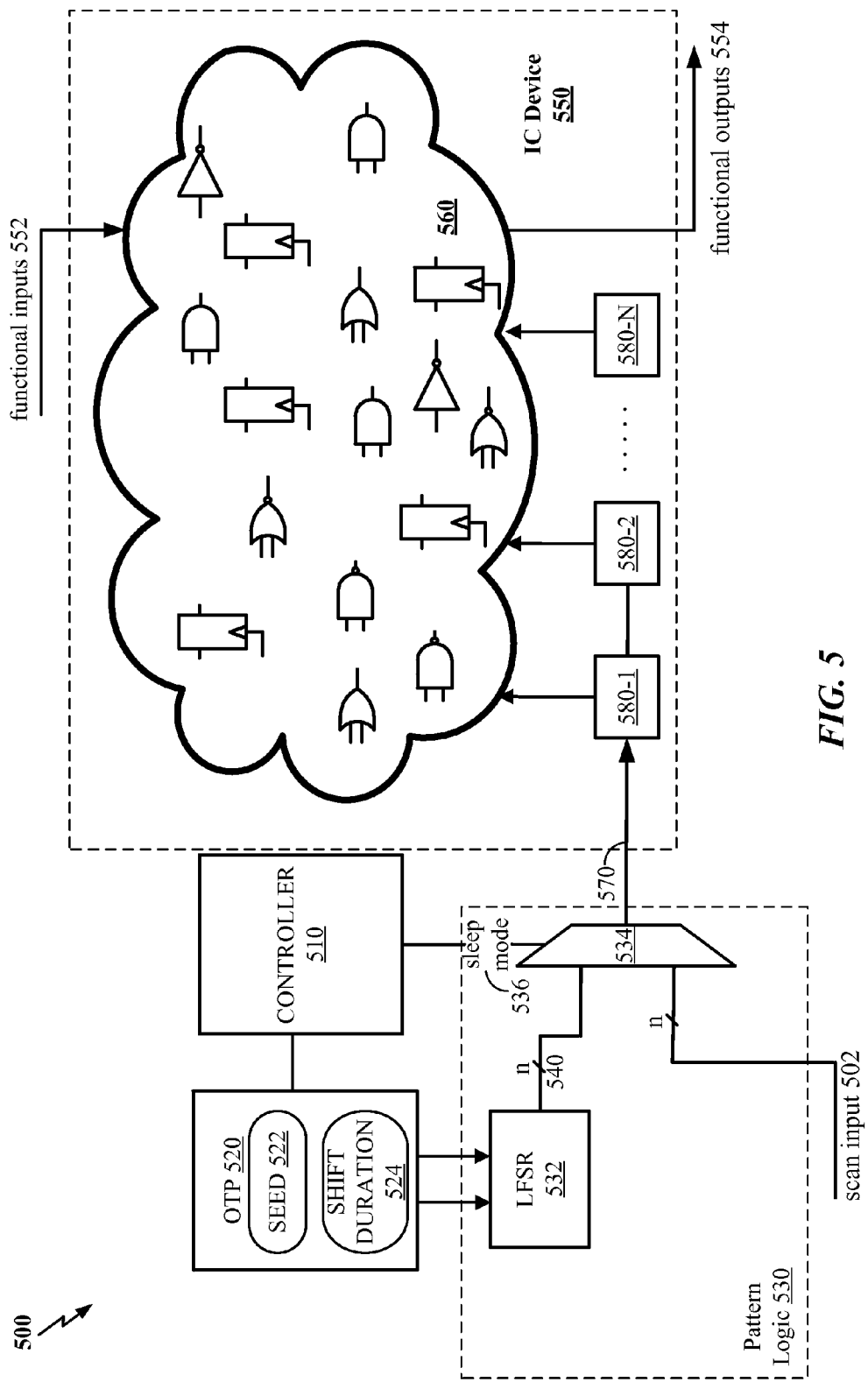
FIG. 5 is a schematic diagram of logic circuitry for implementing a static low power retention state according to an illustrative aspect of the disclosure.

FIG. 5 is a schematic diagram of logic circuitry 500 for implementing a static low power retention state of an IC device 550 according to an illustrative aspect of the disclosure. Representatively, the IC device 550 includes functional inputs 552 and functional outputs 554 for multiple logic elements 560. The logic elements 560 may include, but are not limited to, flip flops, AND gates, OR gates, NAND gates, NOR gates, XOR gates, inverters, and other like combinational logic. Also shown is a scan chain 570 that is part of an existing scan infrastructure of the IC device 550 that includes device control registers 580 (580-1, . . . , 580-N). In this configuration, the existing scan chain infrastructure (e.g., scan chain 570 for production testing) of the IC device 550 of an IC design is reused for the purpose of the loading the device control registers 580 with a test pattern to achieve a static low power retention state of the logic elements 560 prior to entering a voltage scaling mode.

In one configuration, generation of the test vector pattern involves the use of a pseudo-random pattern generator whose polynomial, and whose programmable seed and run duration (in cycle count) are configured for preconditioning the IC device 550 to a static low power retention state. As shown in FIG. 5, a pattern logic 530 includes a linear feedback shift register (LFSR) 532 that generates a test vector pattern 540 in response to a seed value 522 (e.g., a predetermined seed value) and a predetermined shift duration 524 (e.g., a clock cycle count). In this configuration, the seed value 522 and the predetermined shift duration 524 determine the test vector pattern 540 stored within the device control registers 580. The test vector pattern 540 stored within the device control registers 580 represents a series of values (e.g., bit values) that cause the device control registers 580 to implement a minimum leakage state (MLS) for the logic elements 560 of the IC device 550.

In this configuration, the test vector pattern 540 may be determined, for example, during a pre-silicon stage as representing the stored series of values within the device control registers 580 that cause the IC device 550 to enter a static low power retention state that approximates the minimum leakage state of the IC device 550. Alternatively, the test vector pattern 540 may be determined following device fabrication by testing different test vector patterns. Rather than store the test vector pattern 540, the seed value 522 and the predetermined shift duration 524 enable the generation of the test vector pattern 540 during operation of the IC device 550.

In operation, a controller 510 bypasses a scan input 502 of the scan chain 570, prior to a sleep mode 536, using a multiplexer 534. The controller 510 feeds the seed value 522 and the predetermined shift duration 524 stored in a memory (e.g., a one-time programmable memory 520 (OTP)) to the LFSR 532. In response, the LFSR 532 operates for the predetermined shift duration 524 and in response to the seed value 522 outputs the test vector pattern 540, such that the bits of the test vector pattern 540 are serially clocked into the scan chain 570 and the device control registers. In this aspect of the disclosure, the existing scan chain infrastructure (e.g., scan chain 570) of the IC device 550 is reused for the purpose of loading the device control registers 580. Driving of the test vector pattern 540 causes the logic elements 560 to achieve the static low power retention state prior to entering a voltage scaling mode. When the test vector pattern 540 is driven through the existing scan chain infrastructure of the operating IC device, the IC device 550 is placed in the static low power retention state during the sleep mode of operation. Upon returning from the static low power retention state, the controller 510 may assert a reset signal to the IC Device 550 for clearing memory (e.g., flip-flops) before restoring the saved state on wake-up from the sleep mode of operation.

Aspects of the present disclosure also include a method of determining the minimum leakage state of an IC design using existing tools. In an illustrative aspect, the problem of generating a minimum leakage state of combinational logic in an IC design is modeled as an automatic test pattern generator (ATPG) problem so that existing ATPG tools can be used to generate the minimum logic state. An example of a common ATPG tool that can be used for minimum leakage state generation according to illustrative aspects of the present disclosure is the Tessent® FastScan™ by Mentor Graphics® of Wilsonville, Oreg.

A method for determining a minimum leakage state using ATPG tools according to aspect one aspect of the present disclosure involves operation of the ATPG tool according to a bridging fault model. The ATPG tool, based on the bridging fault model, may place values at each node in an IC design to achieve a low power retention state that approximates to a minimum leakage state. For CMOS digital logic, each state may have an associated leakage power. The bridging fault model may be used as a mechanism to translate the MLS generation problem into an ATPG problem that iteratively determines the static low power state to form a test vector pattern that preconditions the IC device 550 into a state that approximates the MLS.

Figure 6:
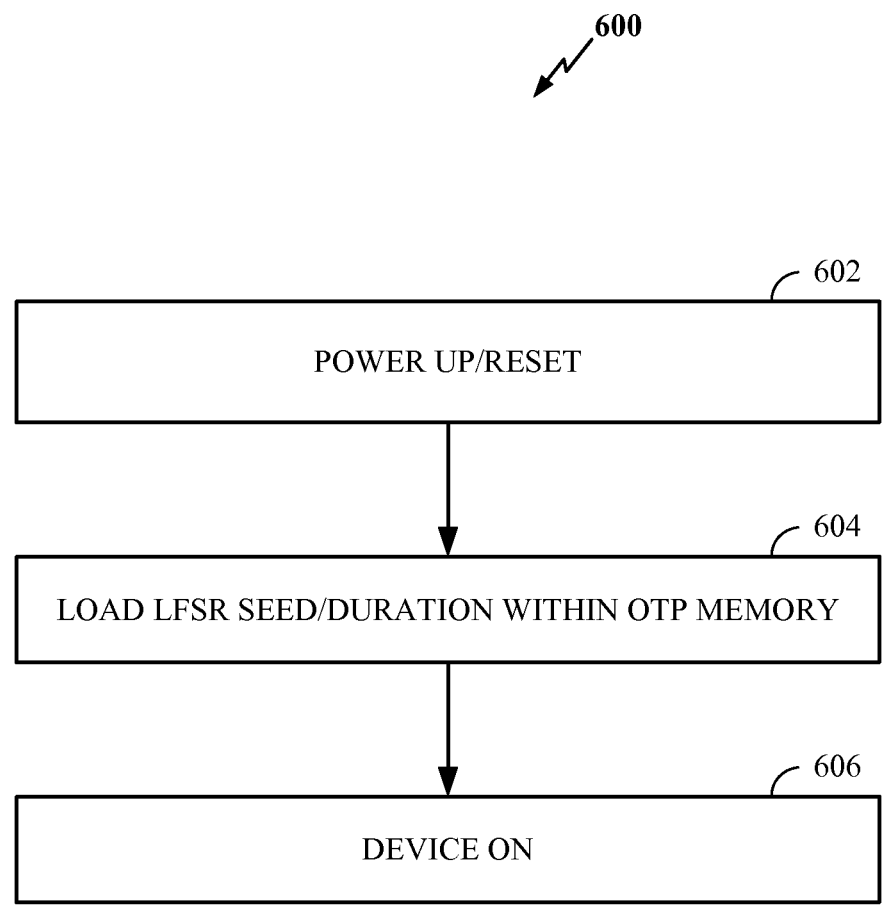
FIG. 6 is a process flow diagram showing a method for implementing a static low power retention state according to an illustrative aspect of the present disclosure.

FIG. 6 is a process flow diagram showing an initialization method 600 for implementing a static low power retention state according to an illustrative aspect of the present disclosure. At block 602, a power up/reset state is detected, for example, as part of an IC design initialization. Following the power up/reset state, a seed value and a shift duration value for a linear feedback shift register (LFSR) are loaded within a memory at block 604. For example, as shown in FIG. 5, the seed value 522 and the shift duration are stored within the one-time programmable memory 520. At block 606, the IC design is active. As shown in FIG. 5, a pattern logic 530 includes the LFSR 532 that generates the test vector pattern 540 in response to the seed value 522 after running for the predetermined shift duration 524.

Figure 7:
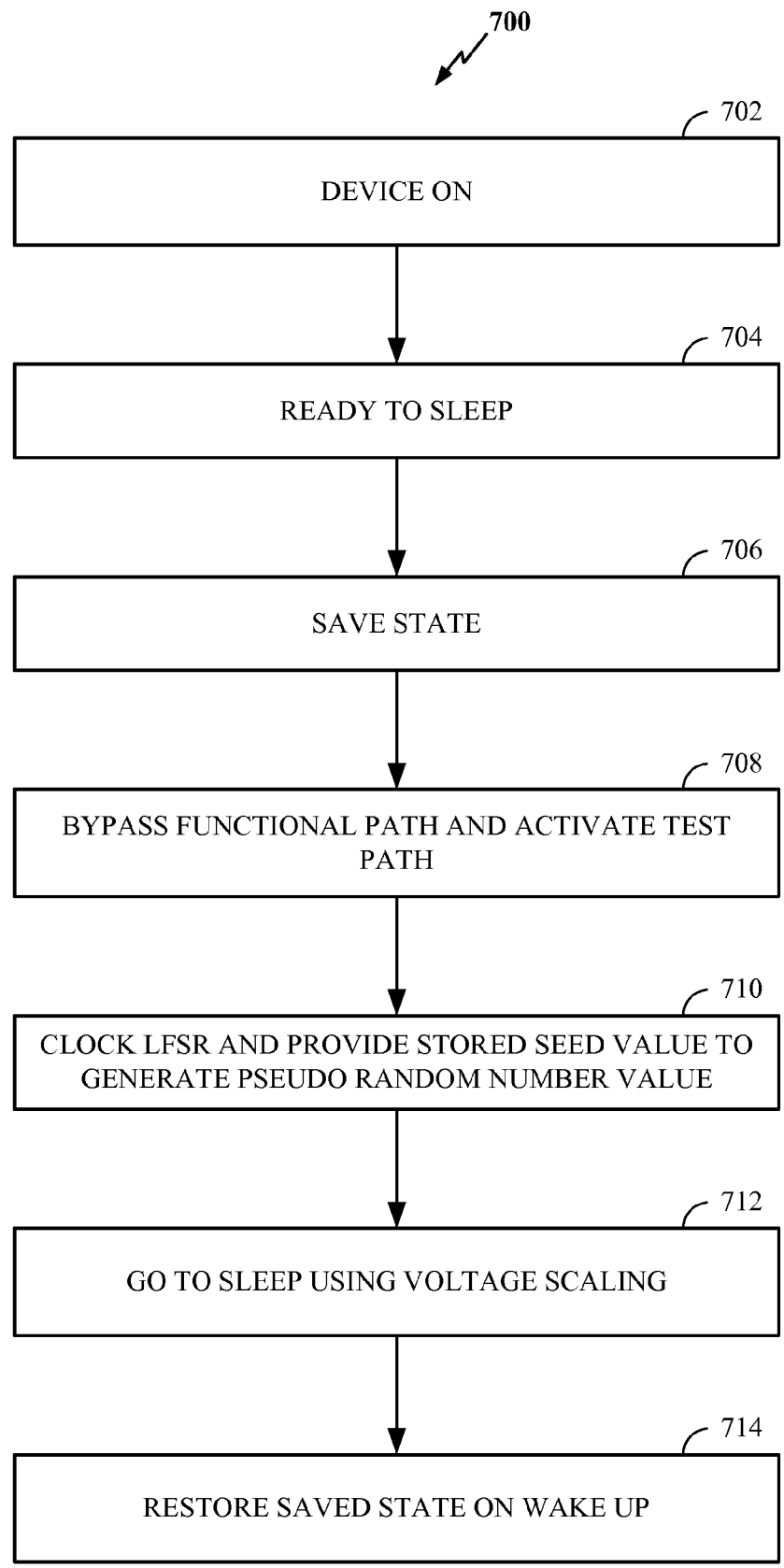
FIG. 7 is a process flow diagram showing a method for implementing a static low power retention state according to an illustrative aspect of the present disclosure.

FIG. 7 is a process flow diagram showing a method 700 for implementing a static low power retention state according to an illustrative aspect of the present disclosure. At block 702, an IC device of an IC design is active. At block 704, the operating IC device is ready to sleep. At block 706, a state of the IC device is saved. At block 708, a test path is activated to bypass a functional path. For example, as shown in FIG. 5, a controller 510 bypasses a scan input 502 of the scan chain 570, prior to a sleep mode 536, using a multiplexer 534. At block 710, a pseudo random number generator is clocked and provided a stored seed value to generate a pseudo random number value. For example, as shown in FIG. 5, the controller 510 feeds the seed value 522 and the predetermined shift duration 524 stored in the one-time programmable memory 520 to the LFSR 532. In response, the LFSR 532 operates for the predetermined shift duration 524 and in response to the seed value 522 outputs the test vector pattern 540. The controller 510 is configured for serially clocking bits of the test vector pattern 540 through scan chain 570 coupled to the logic elements 560 of the IC device 550 until the test vector pattern is loaded into the device control registers 580 of the IC device 550.

Referring again to FIG. 7, at block 712, the IC device transitions to a sleep mode in response to the driving of the pseudo random number value within the scan chains of the IC device. For example, as shown in FIG. 5, the controller 510 is configured to reduce a power supply voltage to place the IC device 550 in a voltage scaling mode after driving the pseudo random number value. At block 714, a state of the IC device is restored once the IC device awakes from the sleep mode of operation into a non-sleep state. For example, as shown in FIG. 5, the controller 510 is configured to increase the power supply voltage upon returning to the non-sleep state.

Figure 8:
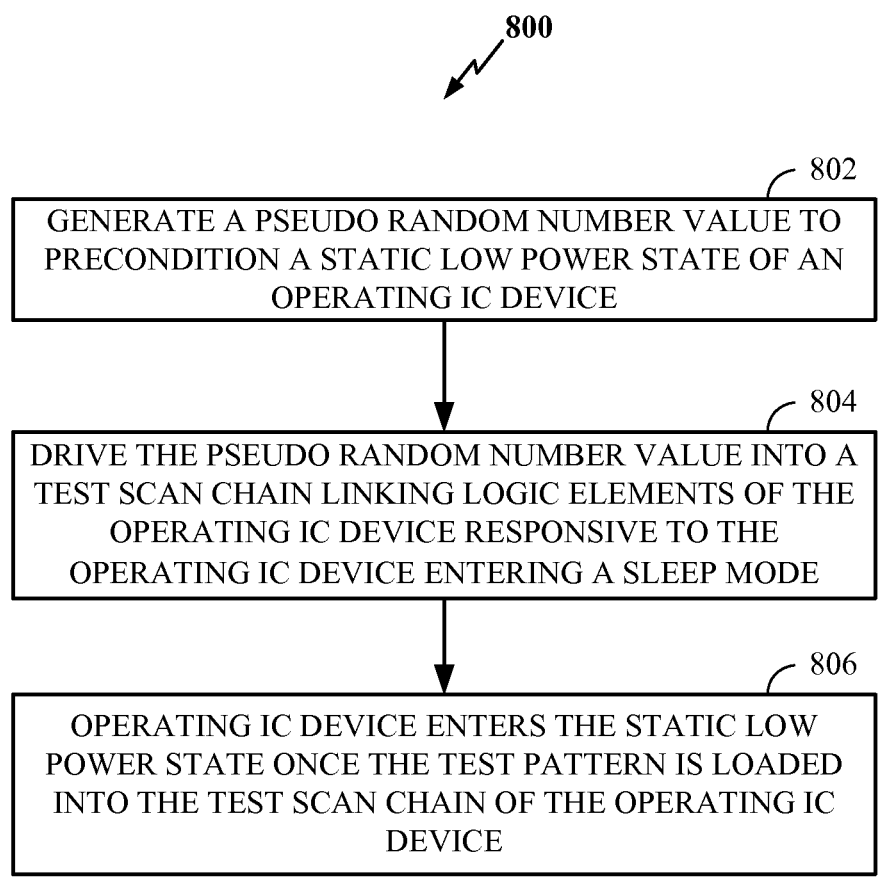
FIG. 8 is a process flow diagram showing a method for implementing a static low power retention state according to an illustrative aspect of the present disclosure.

FIG. 8 is a process flow diagram showing a method 800 for implementing a static low power retention state according to an illustrative aspect of the present disclosure. At block 802, a pseudo random number value is generated to pre-condition a static low power retention state of an operating integrated circuit (IC) device. For example, as shown in FIG. 5, the LFSR 532 operates for the predetermined shift duration 524 and in response to the seed value 522 from the controller 510 outputs the test vector pattern 540.

Referring again to FIG. 8, at block 804, the pseudo random number value is driven into at least one test scan chain linking logic elements of the operating IC device responsive to the operating IC device entering a sleep mode. For example, as shown in FIG. 5, an existing scan chain infrastructure (e.g., scan chain 570) of the IC device 550 is reused for the purpose of loading the device control registers 580. At block 806, the IC device enters the static low power retention state once the pseudo random number value is completely load into the scan chain of the IC device. For example, as shown in FIG. 5, when the test vector pattern 540 is driven through the existing scan chain infrastructure of the IC device, the IC device 550 is placed in the static low power retention state during the sleep mode of operation.

One aspect of the disclosure involves a linear feedback shift register (LFSR) based generator that is invoked to place an operating IC device into the static low power retention state (e.g., a known lowest quiescent current state in which IDDQ (current) testing is performed), prior to invoking voltage scaling. During design time, hardware support for the LFSR generator as well as scan chains and counters are provided. Using a final logic netlist of the IC design, simulations are run to determine the test vector pattern (e.g., using IDDQ pattern generation methods). The test vector pattern is then mapped back to the LFSR generator. The LFSR generator is adjusted to enable generation of the test vector pattern with a sufficiently small number of clock cycles (e.g., the cycle duration). In addition, the counters are used to count the number of clock cycles to propagate a seed vector to the low power retention state (e.g., an IDDQ state) when the device enters sleep mode with voltage scaling methods. This configuration enables a minimum IC device sleep power for modes that use static voltage scaling, and also enables conformance with published customer specifications. This technique may also be combined with other low power techniques such as clock gating, back biasing, and the like.

Figure 9:
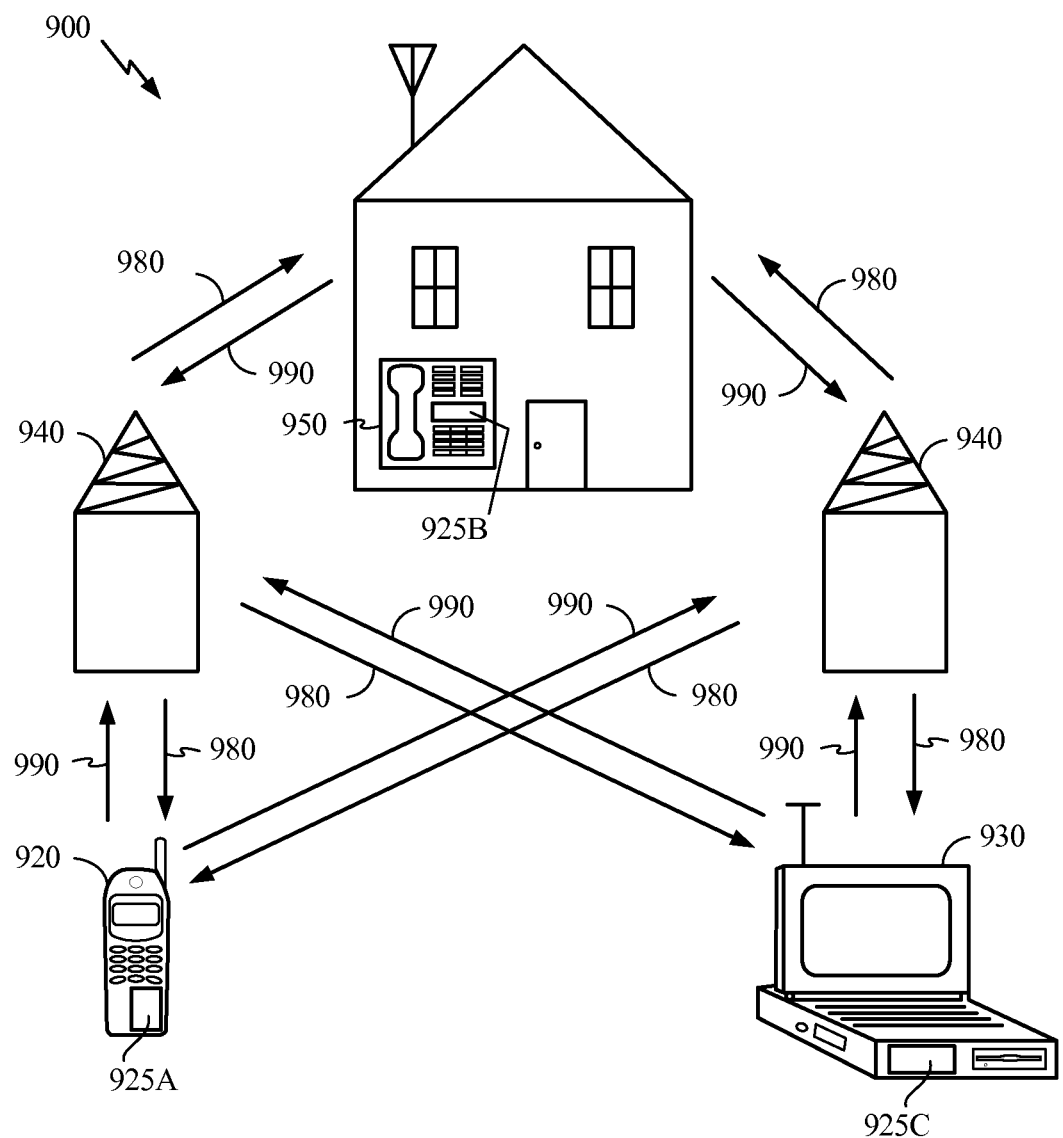
FIG. 9 is a block diagram showing an exemplary wireless communication system in which an aspect of the disclosure may be advantageously employed.

FIG. 9 is a block diagram showing an exemplary wireless communication system 900 in which an aspect of the disclosure may be advantageously employed. For purposes of illustration, FIG. 9 shows three remote units 920, 930, and 950 and two base stations 940. It will be recognized that wireless communication systems may have many more remote units and base stations. Remote units 920, 930, and 950 include IC devices 925A, 925C and 925B, which include the disclosed circuitry. It will be recognized that any device containing an IC may also include the circuitry disclosed here, including the base stations, switching devices, and network equipment. FIG. 9 shows forward link signals 980 from the two base stations 940 to the remote units 920, 930, and 950 and reverse link signals 990 from the remote units 920, 930, and 950 to the two base stations 940.

In FIG. 9, one of the remote units 920 is shown as a mobile telephone, one of the remote units 930 is shown as a portable computer, and one of the remote units 950 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or any other device that stores or retrieves data or computer instructions, or any combination thereof. Although FIG. 9 illustrates remote units according to the teachings of the disclosure, the disclosure is not limited to these exemplary illustrated units. Aspects of the disclosure may be suitably employed in any device, which includes integrated circuits (ICs).

Figure 10:
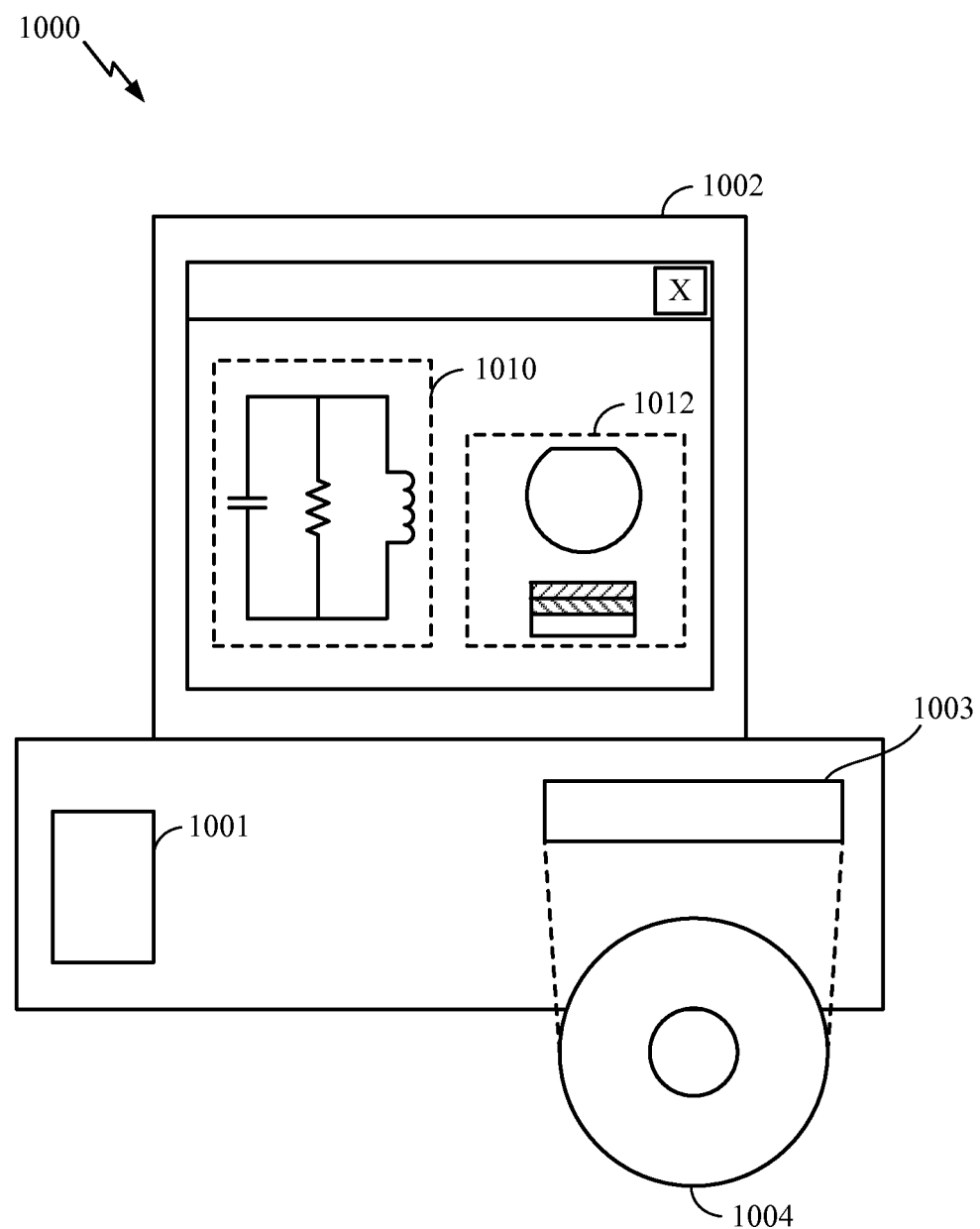
FIG. 10 is a block diagram illustrating a design workstation used for circuit, layout, and logic design of a semiconductor component according to an aspect of the present disclosure.

FIG. 10 is a block diagram illustrating a design workstation used for circuit, layout, and logic design of a semiconductor component, such as a static low power retention state circuitry as disclosed above. A design workstation 1000 includes a hard disk 1001 containing operating system software, support files, and design software such as Cadence or OrCAD. The design workstation 1000 also includes a display to facilitate a circuit design 1010 or a semiconductor component 1012 such as a packaged integrated circuit having MLS generation circuitry. A storage medium 1004 is provided for tangibly storing the circuit design 1010 or the semiconductor component 1012. The circuit design 1010 or the semiconductor component 1012 may be stored on the storage medium 1004 in a file format such as GDSII or GERBER. The storage medium 1004 may be a CD-ROM, DVD, hard disk, flash memory, or other appropriate device. Furthermore, the design workstation 1000 includes a drive apparatus 1003 for accepting input from or writing output to the storage medium 1004.

Data recorded on the storage medium 1004 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1004 facilitates the design of the circuit design 1010 or the semiconductor component 1012 by decreasing the number of processes for designing semiconductor wafers.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to any type of long term, short term, volatile, nonvolatile, or other memory and is not to be limited to any particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although specific circuitry has been set forth, it will be appreciated by those skilled in the art that not all of the disclosed circuitry is required to practice the disclosure. Moreover, certain well known circuits have not been described, to maintain focus on the disclosure. Similarly, although the description refers to logical "0" and logical "1" in certain locations, one skilled in the art appreciates that the logical values can be switched, with the remainder of the circuit adjusted accordingly, without affecting operation of the present disclosure.

Although the present disclosure and its advantages have been described in detail, it should be understood that various changes, substitutions and alterations can be made herein without departing from the technology of the disclosure as defined by the appended claims. Moreover, the scope of the present application is not intended to be limited to the particular aspects of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding aspects described herein may be utilized according to the present disclosure. Accordingly, the appended claims are intended to include within their scope such processes, machines, manufacture, compositions of matter, means, methods, or steps.

What is claimed is:

1. A method for preconditioning an operating integrated circuit (IC) device in a static low power retention state, comprising:
generating a pseudo random number value using a pseudo random number generator to pre-condition the static low power retention state of the operating IC device; and
driving the pseudo random number value into a test scan chain linking logic elements of the operating IC device responsive to the operating IC device entering a sleep mode, the pseudo random number value placing the operating IC device into the static low power retention state.

2. The method of claim 1, further comprising operating the pseudo random number generator using a predetermined seed value and a predetermined duration to generate the pseudo random number value.

3. The method of claim 2, further comprising:
determining the static low power retention state of the operating IC device using an automatic test pattern generation tool prior to fabrication of the operating IC device;
determining a test pattern from the automatic test pattern generation tool to achieve the static low power retention state; and
computing the predetermined seed value and the predetermined duration for generating the test pattern as the pseudo random number value.

4. The method of claim 1, further comprising reducing a power supply voltage to place the operating IC device in a voltage scaling mode after driving the pseudo random number value.

5. The method of claim 4, further comprising increasing the power supply voltage upon returning to a non-sleep state.

6. The method of claim 1, in which driving the pseudo random number value into the test scan chain linking logic elements of the operating IC device comprises serially clocking bits of the pseudo random number value through the test scan chain linking logic elements of the operating IC device until the pseudo random number value is loaded into the operating IC device.

7. The method of claim 1, further comprising saving a state of the operating IC device prior to driving the pseudo random number value into the operating IC device.

8. The method of claim 7, further comprising restoring the state upon returning to a non-sleep state.

9. An apparatus to pre-condition an operating integrated circuit (IC) device in a static low power retention state, comprising:
a pseudo random number generator configured to generate a pseudo random number value to pre-condition the static low power retention state of the operating IC device; and
a controller configured to drive the pseudo random number value into a test scan chain linking logic elements of the operating IC device responsive to the operating IC device entering a sleep mode, the pseudo random number value placing the operating IC device into the static low power retention state.

10. The apparatus of claim 9, further comprising a memory configured to store a predetermined seed value and a predetermined duration to generate the pseudo random number value.

11. The apparatus of claim 9, in which the controller is further configured to reduce a power supply voltage to place the operating IC device in a voltage scaling mode after driving the pseudo random number value.

12. The apparatus of claim 11, in which the controller is further configured to increase the power supply voltage upon returning to a non-sleep state.

13. The apparatus of claim 9, in which the controller is further configured to serially dock hits of the pseudo random number value through the test scan chain linking logic elements of the operating IC device until the pseudo random number value is loaded into the operating IC device.

14. An apparatus to pre-condition an operating integrated circuit (IC) device in a static low power retention state, comprising:
a means for generating a pseudo random number value to pre-condition the static low power retention state of the operating IC device; and
a means for driving the pseudo random number value into a test scan chain linking logic elements of the operating IC device responsive to the operating IC device entering a sleep mode, the pseudo random number value placing the operating IC device into the static low power retention state.

15. The apparatus of claim 14, further comprising a means for storing a predetermined seed value and a predetermined duration to generate the pseudo random number value.

16. The apparatus of claim 14, further comprising a means for reducing a power supply voltage to place the operating IC device in a voltage scaling mode after the means for driving the pseudo random number value.

17. The apparatus of claim 16, further comprising a means for increasing the power supply voltage upon returning to a non-sleep state.

18. The apparatus of claim 14, further comprising a means for serially clocking hits of the pseudo random number value through the test scan chain linking logic elements of the operating IC device until the pseudo random number value is loaded into the operating IC device.

19. The apparatus of claim 14, further comprising:
a means for determining the static low power retention state of the operating IC device using an automatic test pattern generation tool prior to fabrication of the operating IC device;
a means for determining a test pattern from the automatic test pattern generation tool to achieve the static low power retention state;
a means for computing a predetermined seed value and a predetermined duration for generating the test pattern as the pseudo random number value; and
a means for operating the means for generating using the predetermined seed value and the predetermined duration to generate the pseudo random number value.

20. The apparatus of claim 14, further comprising:
a means for saving a state of the operating IC device prior to driving the pseudo random number value into the operating IC device; and
a means for restoring the state upon returning to a non-sleep state.

* * * * *